United States Patent
Blackham et al.

(10) Patent No.: US 6,836,743 B1
(45) Date of Patent: Dec. 28, 2004

(54) COMPENSATING FOR UNEQUAL LOAD AND SOURCE MATCH IN VECTOR NETWORK ANALYZER CALIBRATION

(75) Inventors: David V. Blackham, Santa Rosa, CA (US); Douglas K. Rytting, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 214 days.

(21) Appl. No.: 10/273,015

(22) Filed: Oct. 15, 2002

(51) Int. Cl.[7] ............................ G06F 19/00; G01R 35/00
(52) U.S. Cl. ....................................... 702/107; 324/601
(58) Field of Search ............................ 702/107; 324/601

(56) References Cited

U.S. PATENT DOCUMENTS

| | | | |
|---|---|---|---|
| 5,748,000 A | * 5/1998 | Blackham ................... 324/601 |
| 5,758,000 A | 5/1998 | Blackham |
| 6,060,888 A | * 5/2000 | Blackham et al. .......... 324/601 |
| 6,300,775 B1 | * 10/2001 | Peach et al. ................. 324/601 |
| 6,496,785 B1 | * 12/2002 | Nakayama et al. .......... 702/117 |

OTHER PUBLICATIONS

Madonna et al., Testing Microwave Devices Under Different Source Impedance Values– A Novel Technique for On–Line Measurement of Source and Device Reflection Coefficients, Apr. 2000, IEEE Transactions on Instrumentation and Measurment, vol. 49, No. 2.*

* cited by examiner

Primary Examiner—John Barlow
Assistant Examiner—Toan M. Le (57) ABSTRACT

A method and a vector network analyzer compensate for unequal source match and load match of a test port of the vector network analyzer. The method characterizes the source match and the load match, computes a delta-match factor from the characterized source match and load match, and uses the delta-match factor to compensate for the difference. The method compensates S-parameter data for a device under test measured by the vector network analyzer. The vector network analyzer comprises a computer program that, when executed by a controller, implements a calibration compensation.

33 Claims, 5 Drawing Sheets

Prior Art

COMPENSATING FOR UNEQUAL LOAD AND SOURCE MATCH IN VECTOR NETWORK ANALYZER CALIBRATION

TECHNICAL FIELD

The invention relates to electronic test equipment. In particular, the present invention relates to calibration of electronic test equipment systems such as vector network analyzers.

BACKGROUND ART

A network analyzer is a test system that characterizes the performance of radio frequency (RF) and microwave/millimeter wave DUTs in terms of network scattering parameters. Network scattering parameters, more commonly known as 'S-parameters', are transmission and reflection (T/R) coefficients for the DUT computed from measurements of voltage waves traveling toward and away from a port or ports of the DUT. In general, S-parameters are expressed either in terms of a magnitude and phase or in an equivalent form as a complex number having a real part and an imaginary part. For example, a set of four S-parameters, namely $S_{11}$, $S_{12}$, $S_{21}$, and $S_{22}$ each represented by a complex number, provide a complete characterization of a linear RF performance of a given two-port DUT at a single frequency. A network analyzer capable of measuring both the magnitude and phase of the S-parameters of the DUT is called a vector network analyzer (VNA).

As with all test equipment, VNAs can and do introduce errors into measured S-parameter data. The presence of these errors distorts or corrupts the measurement of actual S-parameters of the DUT by the test system. The characterization and subsequent removal of the effects of systematic errors is often called error correction or calibration. Generally, a VNA calibration involves determining values for error coefficients associated with an error model of a measurement system. For calibration purposes, the 'measurement system' generally includes the VNA along with any cables, adapters, test fixtures that are to be employed while testing a DUT. Thus a VNA error model attempts to account for all, or at least the most significant, sources of the systematic errors in terms of constituent error coefficients of the error model. Once determined through VNA calibration, the error coefficients are used in conjunction with the error model to mathematically correct for the effects of the systematic errors in the measured S-parameter data for the DUT produced by the VNA. The data after calibration-related correction is typically called 'calibrated data' and represents a more accurate indication of actual performance of the DUT than uncalibrated or raw data.

All of the major systematic errors associated with using a VNA to measure S-parameters can be accounted for by six types of errors: directivity and crosstalk related to signal leakage, source and load impedance mismatches related to reflections, and frequency response errors related to reflection and transmission tracking within test receivers of the network analyzer. Thus, for a VNA measuring S-parameters of a general two-port DUT, there are six forward-error terms and six reverse-error terms for a total of twelve error coefficients or terms (including two terms that combine the various transmission crosstalk terms into a forward crosstalk or a reverse crosstalk term). Such a full measurement calibration for a general two-port DUT is often referred to as a 'twelve-term' error correction or calibration using a twelve-term error model. An extension of the twelve-term error model for a full measurement calibration of a multiport network analyzer (i.e., a network analyzer having more than two ports) often is referred to as a twelve-term error model also, even though such an error model necessarily has more than twelve terms.

In addition to the twelve-term error models, simpler and in some cases, more accurate error models known as 'eight-term' error models have been developed and are routinely used in situations and under constraining circumstance that allow their use. The eight-term error models actually include two additional terms, for a total of ten, when crosstalk is considered. Thus, the eight-term error model includes two fewer error terms than the twelve-term model when considering a two-port network analyzer or a two-port DUT. A principal difference between the eight-term and twelve-term models is that the twelve-term model has a separate error term for a source match and a load match at each test port of the VNA. Eight-term models, and extensions of such models to multiport VNAs, have only a single match term for each test port of the VNA.

Unfortunately, due to the presence of a single port match error term, eight-error terms are unable to explicitly account for actual differences in the source match and the load match at a test port of the VNA for many VNA configurations. In particular, a VNA may be completely and correctly calibrated using an eight-term error model only if the equivalent test port source match and load match are equal. As such, there are often severe limitations to the applicability of eight-term error models for VNA calibration.

Since VNA calibration using an eight-term model often offers significant practical advantages relative to calibration using a twelve-term model, approaches have been developed to circumvent or overcome the inadequacy of the eight-term model to account for source/load differences. In some cases, an eight-term calibration may be employed when the source/load differences are small enough to simply ignore. In other cases, the difference is accounted for by a mathematical compensation using additional measurements of the test system. Conventionally, accounting and compensating for source/load match differences through the use of additional measurements require supplementary test hardware, such as the use of precision, broadband dual reflectometers at each test port. Thus, the use of an eight-term error calibration for a VNA with a source/load match difference at one or more test ports generally requires a more expensive test system.

Accordingly, it would be advantageous to compensate a calibration of a VNA for the effects of differences in test port source and load match, especially when employing a calibration that does not inherently account for such differences. Moreover, it is desirable that such a compensated calibration not require the use of dual reflectometers at each of the test ports. Such a compensated calibration would solve a long-standing need in the area of VNA calibration and, in particular, in the area of VNA calibration using eight-term error models.

SUMMARY OF THE INVENTION

The present invention compensates a calibration of a vector network analyzer (VNA) using an error model calibration. In particular, the present invention compensates or corrects for differences in a source match and a load match of a test port of the VNA, where the differences are otherwise unaccounted for by the error model being employed. In addition, the present invention also may compensate for differences in a directivity transmission tracking term and a reflection tracking term of the error model associated with a test port of the VNA due to switching of receivers at the test port. The present invention may be used to compensate any eight-term model-based VNA calibration or multi-port extension thereof such that accurate, 'calibrated' measurements of a device under test (DUT) are produced by the VNA employing the calibration.

In an aspect of the present invention, a method of compensating a calibration of a VNA is provided. The method comprises characterizing a source match and a load match of a test port of the VNA. The method of compensating further comprises computing a test port delta-match factor from the characterized source match and load match. The method applies to a multiport VNA having two or more test ports.

In some embodiments, the method of compensating a calibration further comprises correcting or compensating measured S-parameters data for a device under test (DUT) using the delta-match factor. Raw or uncalibrated S-parameter data for the DUT is first compensated for the source/load match difference using the delta-match factor to generate compensated raw S-parameter data. Then the compensated raw S-parameter data is corrected for systematic errors through the application of a multi-term calibration correction to produce both compensated and calibrated S-parameter data. In other embodiments, the method of compensating a calibration further comprises modifying or compensating error coefficients of the multi-term error model using the delta-match factor. The modified error coefficients are used to correct the raw S-parameter data taken for the DUT.

In another aspect of the present invention, a method of compensating a calibration of a multiport vector network analyzer having switched receivers is provided. The method of compensating a calibration of a multiport network analyzer comprises characterizing a source match and a load match of each of a plurality of test ports of the VNA. The method of compensating further comprises computing a test port delta-match factor from each characterized source match and load match. The method further comprises computing a set of receiver switching factors for each test port. The method further comprises compensating error coefficients of a multi-term error model using the delta-match factor, and computing some of the error coefficients of the multi-term error model from other error coefficients using the receiver switching factors. In yet another aspect of the present invention, a vector network analyzer (VNA) comprising a compensated calibration according to the present invention is provided.

Advantageously, the compensation of the present invention is accomplished without resorting to the use of precision dual reflectometers at each VNA test port and without requiring a complete calibration of each pair of ports in a multiport configuration. In particular, it is unnecessary to characterize each possible combination of receiver and source port in a switched receiver, multiport VNA according to the present invention. Instead, the present invention utilizes a characterization of the source/load match differences for the VNA test ports that is independent of the calibration that is to be compensated. Thus, not only may any multi-term error model calibration be used with the invention, but also the present invention may be implemented as a 'factory calibration' and/or a 'field calibration'. Furthermore, the present invention can be realized in existing VNAs as a firmware upgrade without requiring modification of the VNA hardware.

Moreover, the compensation of the present invention facilitates the use of eight-term calibration approaches in VNAs that exhibit differences in source and load matches at the test ports without the ability to monitor and/or remove those differences. Since monitoring the differences in source and load matches are often associated with higher cost VNAs, the present invention can provide a more economical solution to obtaining accurate S-parameter measurements for DUTs, especially so-called 'non-connectorized' DUTs, where eight-term error model calibrations are preferred over the twelve-term calibration. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention provides a method of compensating a calibration of a vector network analyzer (VNA) and a VNA having a compensated calibration. The method and VNA of the present invention compensate for a difference in a source match and a load match of one or more test ports of the VNA. Moreover, the invention may also compensate for directivity, reflection tracking, and transmission tracking term differences in an error model-based calibration that can occur in multiport systems where switching between different signal detection circuitry at various test ports of the VNA is employed. The present invention facilitates the production of accurate, compensated, calibrated, S-parameter data for a device under test (DUT). Preferably and advantageously, the compensation of the present invention is a numerical compensation and can be implemented as a firmware upgrade to existing VNAs without the need for hardware or architecture changes to the VNA and/or to any associated, test setup or test fixture.

The calibration of a multiport VNA is described herein in terms of taking or considering two ports at a time, as is consistent with conventional application of twelve-term and eight-term model-based calibrations thereto. The multiport VNA calibration is described herein in terms of two ports at a time solely for the purposes of facilitating discussion and is not intended to limit the scope of the present invention in any way. One skilled in the art can readily extend the concepts presented hereinbelow to a multiport VNA that measures a multiport DUT taking more than two ports at a time. All such extensions are within the scope of the present invention.

Therefore for purposes of discussion herein, the multiport VNA is a VNA having a test port designated as 'port-i' and another test port designated as 'port-j', where the port designators i,j are integers greater than or equal to '1', and wherein i is not equal to j. For example, a two-port VNA that measures S-parameters of a two-port DUT has two test ports that may be designated 'port-1' and 'port-2', such that i equals '1' and j equals '2'. Further, the term 'multiport' used herein means greater than or equal to two ports.

The present invention is applicable to the use of any error model-based VNA calibration, especially the use of error models generically referred to herein as 'eight-term' error model-based calibrations that do not explicitly account for source/load match differences. In particular, the present invention applies to eight-term calibrations including, but not limited to, thru-reflect-line (TRL), line-reflect-line (LRL), thru-reflect-match (TRM), and line-reflect-match (LRM) and any multiport extensions thereof. As one skilled in the art is aware, all eight-term error model-based calibrations are essentially equivalent. Therefore, the TRL calibration will be used to represent all eight-term calibrations in the discussion hereinbelow without loss of generality or limitation of scope. The TRL calibration is an eight-term error model-based calibration known in the art that uses a thru standard, a reflection standard, such as a short or open, and a line standard (e.g., a length of transmission line) as calibration standards. Likewise for simplicity, all equivalent twelve-term error model calibration methodologies will be represented hereinbelow by the conventional short-open-load-thru (SOLT) calibration. The SOLT calibration employs four calibration standards consisting of a short circuit ('short'), an open circuit ('open'), a load, and a through ('thru') to uniquely determine the twelve error coefficients of the twelve-term error model.

As used herein, a calibration standard may be any device for which the S-parameters are known with sufficiently high accuracy to accomplish the calibration. By making measurements with the VNA of several different calibration standards (i.e., a calibration kit), it is possible to develop and solve a set of linear equations for the error coefficients of the error model. The error coefficients, so determined in conjunction with a particular error model, then can be used to allow corrected or 'calibrated' S-parameter data to be reported by the 'calibrated' VNA. In general, as long as there are as many as or more independent equations (i.e., measurements of known calibration standards) than there are unknown error coefficients in the error model, the error coefficients of the error model can be determined uniquely.

For twelve-term models, such as is used in the SOLT calibration, calibration accuracy is directly related to the accuracy of the knowledge of the S-parameters of the calibration standards. On the other hand, the calibration accuracy of an eight-term model-based calibration, such as TRL, is less influenced by the accuracy of the S-parameter models of the calibration standards. Often, eight-term model-based calibrations require less accurate models for some of the standards due to the use of certain, inherent redundancies in the measurements performed during such calibrations. The redundancies allow the eight-term calibration to effectively characterize some of the calibration standard S-parameters during the calibration eliminating the need to completely characterize each of the calibration standards used. In essence, most eight-term calibrations allow for the use of one or more incompletely characterized standards among the set of calibration standards.

In part due to this allowed use of incompletely characterized standards in eight-term calibrations, there are situations in which an eight-term calibration, such as TRL, is advantageous and/or even preferred to a twelve-term calibration. In particular, eight-term calibrations are generally preferred when one or more of the calibration standards cannot be readily constructed and/or characterized with sufficient accuracy to meet calibration goals. For example, it is often difficult or expensive to construct and characterize a set of highly accurate SOLT calibration standards when a test fixture must be used to accommodate a so-called 'non-connectorized' DUT. On the other hand, construction and characterization of a set of TRL standards compatible with the test fixture may be much more readily accomplished. Moreover, given the aforementioned relaxed accuracy requirements of the standards for eight-term calibrations, sometimes an eight-term calibration can produce a more accurate calibration than a twelve-term calibration even when a test fixture is not required.

As referred to herein, the source match of a test port is an observed impedance match looking into the port when the port is acting as a signal source. The load match of a test port is an observed impedance match looking into the port when the port is acting as a signal sink or load. Note that in some multiport VNA configurations, a port may have more than one load match value due to switching of signal detection and measurement components.

Figure 1:
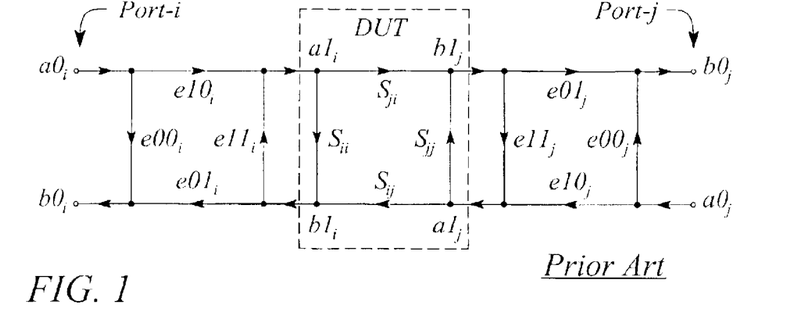
FIG. 1 illustrates an eight-term error model as a flow graph.
Figure 2A:
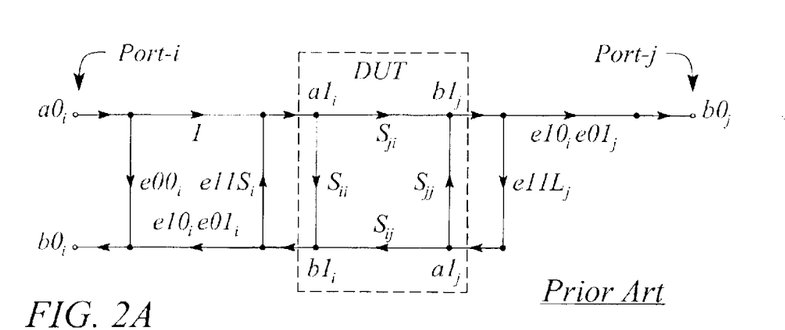
FIG. 2A illustrates a forward portion of a twelve-term error model as a flow graph.
Figure 2B:
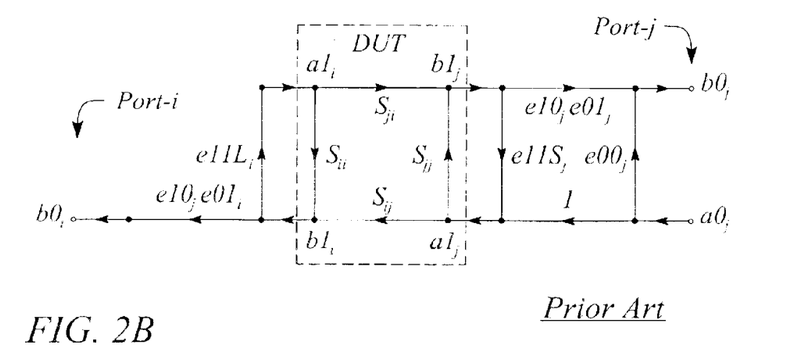
FIG. 2B illustrates a reverse portion of a twelve-term error model as a flow graph.

FIGS. 1, 2A and 2B are provided herein for context purposes only. FIG. 1 illustrates an eight-term error model for a multiport VNA taking two ports at a time. The VNA has an i-th test port (i.e., 'port-i') and a j-th test port (i.e., 'port-j'). The eight-term error model illustrated in FIG. 1 is depicted as a flow graph using conventional node/vertex notation. FIG. 2A illustrates a forward portion of a twelve-term error model for the VNA as a flow graph using conventional flow graph notation. The forward portion of the twelve-term error model for port-i and port-j accounts for systematic errors associated with port-i of the VNA acting as a signal or stimulus source and port-j acting as a signal sink or load. FIG. 2B illustrates a reverse portion of the twelve-term error model for the VNA as a flow graph also using conventional flow graph notation. The reverse portion of the twelve-term error model for port-i and port-j accounts for systematic errors associated with the port-j of the VNA acting as a source and the port-i acting as a sink or load. Crosstalk terms linking port-i and port-j of the twelve-term model have been omitted from the flow graphs illustrated in FIGS. 2A and 2B for clarity and because the crosstalk terms are not germane to the discussion that follows.

As one skilled in the art is aware, conventional flow graph notation represents ports of a system as nodes. As illustrated in FIGS. 1, 2A, and 2B, a node labeled with 'a' indicates an input node and a node labeled with a 'b' indicates an output node. Note that in general, a single physical port of the VNA or DUT can act as both an input node (a-node) and an output node (b-node) due to the hypothetical presence at all physical ports of forward and reverse signals. The vertices of the flow graph represent functional relationships between the nodes that they connect.

Thus, as illustrated in FIG. 1, an input node $a0_i$ of the eight-term error model is connected to an output node $b0_i$ by an error term $e00_i$ representing a directivity error associated with the port-i of the VNA. The vertex labeled $e11S_i$ in FIG. 2A represents a source match error term for the port-i of the VNA when the port-i is serving as a source. Similarly, the vertex labeled $e11L_i$ in FIG. 2B represents a load match error term for the port-i of the VNA when the port-i is serving as a load. The vertices labeled as S-parameters (e.g., $S_{ij}$) in FIGS. 1, 2A and 2B represent S-parameters of the DUT with nodes $a1_i$, $b1_i$ accounting for an first port of the DUT and $a1_j$, $b1_j$ accounting for a second port of the DUT. Vertices with no label are assumed to represent unity (i.e., '1').

One skilled in the art is familiar with flow graphs and their use in graphically representing error models for VNAs. A discussion of calibration standards, SOLT and TRL calibration methods, flow graph representations of error models, and conventional in-fixture calibrations are provided in Agilent application notes AN1287-3, Applying Error Correction to Network Analyzer Measurements; PN 8510-5A, Specifying Calibration Standards for the Agilent 8510 Network Analyzer; and AN 1287-9, In-Fixture Measurement Using Vector Network Analyzers, all three of which are incorporated herein by reference.

The term 'in-fixture testing' as used herein refers to testing a DUT while the DUT is mounted in a test fixture. In general, the test fixture serves two principal roles: adapting a standard interface of the VNA to that of the DUT, and physically/electrically mimicking the mounting environment of the DUT. The test fixture can be as simple or as complex as is required by the test being performed on the DUT. For example, a typical standard interface for the VNA is a set of coaxial cables having one of several standardized connector types on terminating ends. The test fixture can serve as a transition or adaptor between the standardized connectors of the coaxial cables and a non-standard DUT interface (e.g., solder pin or tab). In other situations, the test fixture may provide mounting and power connections as well as serve as an interface adaptor for a DUT standardized connectors. Alternatively, the test fixture may be simply a connector on the end of a cable or a connector adaptor that adapts one connector type to another in a case where the DUT has standardized connectors. The test fixture may even be a null fixture having zero loss, zero electrical length and no parasitics. One skilled in the art is familiar with test fixtures and their use in conjunction with testing DUTs. In particular, one skilled in the art is familiar with the attractiveness of eight-term error model based calibrations, such as TRL in calibrating VNAs for in-fixture testing of a DUT.

Figure 3:
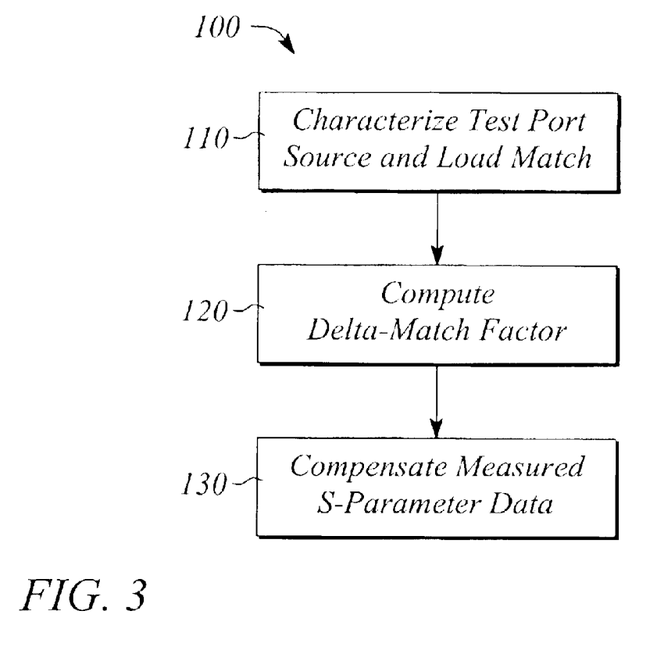
FIG. 3 illustrates a flow chart of an embodiment of a method of compensated calibration of a vector network analyzer according to the present invention.

FIG. 3 illustrates a flow chart of the method 100 of compensating a calibration of a VNA according to the present invention. The method 100 comprises characterizing 110 a source match and a load match of a test port of the VNA. In some embodiments, the source match and the load match of each of a plurality of test ports of the VNA are characterized 110. The step of characterizing 110 comprises determining a value for a source match error term $e11S_i$ and a load match error term $e11L_i$ of an error model at an i-th test port of the VNA. In general, the source and load match error terms or coefficients $e11S_i$, $e11L_i$ are vector quantities represented by a magnitude and phase or equivalently, by a complex number having a real part and an imaginary part. For the purposes of discussion herein, all error coefficients and S-parameters are assumed to be represented by complex numbers unless otherwise noted.

A number of approaches are suitable for and may be used to characterize 110 the source match and the load match of a test port to determine the source and load match error coefficients. Preferably, the source/load match at port-i is characterized by simply measuring or determining values for the source match error coefficient $e11S_i$ and the load match error coefficient $e11L_i$ using a twelve-term calibration, such as SOLT. Since an SOLT calibration can be used to uniquely determine values for all of the error coefficients of the twelve-term error model for both the forward and reverse portions of the model, an SOLT calibration can determine the source match and load match error coefficients $e11S_i$, $e11L_i$ for each test port of the VNA. Thus, for a two-port VNA, an SOLT calibration may be used to measure and determine the port-1 source/load match error coefficients $e11S_1$, $e11L_1$ and the port-2 source/load match error coefficients $e11S_2$, $e11L_2$.

For example, the source match error coefficient $e11S_i$ may be determined directly from a 1-port calibration of the i-th (i.e., 'port-i') wherein port-i acts as a signal source. Similarly, the source match error coefficient $e11S_j$ may be determined directly from a 1-port calibration of the j-th (i.e., 'port-j') wherein port-j acts as a signal source. Such a 1-port calibration of each of port-i and port-j is normally performed as part of a twelve-term calibration, using a short, an open and a load with each port i and j. Completing the twelve-port calibration using a thru connection between port-i and port-j allows the load match error coefficient $e11L_i$ for port-i and the load match error coefficient $e11L_j$ for port-j to be determined.

However, any other method of characterizing 110 the source match and the load match to determine values for the error coefficients $e11S_i$, $e11L_i$ including, but not limited to, employing an eight-term calibration or any derivative method that takes advantage of the relationship between transmission tracking terms and reflection tracking terms to reduce the number of stored error terms is within the scope of the present invention. Moreover, the addition of other terms, such as various crosstalk terms, is also within the scope of the present invention. For example, the use of dual reflectometers on each test port of the VNA to characterize the source/load match is within the scope of the present invention. Likewise, a reduction the eight-term model to a seven-term model and equivalent use of a fifteen-term model, such as is sometimes done when a product of reflection tracking terms equals a product of transmission tracking terms, are also within the scope of the present invention.

Moreover, the error coefficients $e11S_i$, $e11L_i$ may be determined independently during characterization 110 from a subsequent calibration used to calibrate the VNA for testing a DUT. The difference in the source match and the load match values for the ports of the VNA is a function of the VNA and not the DUT or any reciprocal test fixturing used to connect the VNA to the DUT provided that the test fixturing is reciprocal. In particular, as will be further described hereinbelow, it is a source/load match difference that is of principle interest in the step of characterizing 110. Thus, the source match and load match error coefficients $e11S_i$, $e11L_i$ may be determined using an SOLT calibration procedure in a coaxial environment even when the DUT is to be tested in a non-coaxial test fixture, for example.

The method 100 of compensated calibration further comprises computing 120 a delta-match factor $M_i$ for the i-th test port. Preferably, the delta-match factor $M_i$ is computed for each of the i test ports of the VNA. In a preferred embodiment, the delta-match factor $M_i$ for the i-th test port is given by equation (1)

$$M_i = \frac{e11S_i - e11L_i}{e10_i e01_i - e00_i(e11S_i - e11L_i)} \quad (1)$$

where the term $e00_i$ is the i-th port directivity term or coefficient and the product term $e10_i e01_i$ is the i-th port reflection tracking term of the twelve-term error model of FIGS. 2A and 2B with the i-th port acting as the port-1. The source match term $e11S_i$ in equation (1) is the i-th port source match error coefficient $e11S_i$ from the forward portion of the twelve-term error model (i.e., the match term $e11S_i$ when the i-th port is acting as a source). Similarly, the load match term $e11L_i$ in equation (1) is the i-th port load match error coefficient $e11L_i$ from the reverse portion of the twelve-term error model (i.e., the match term when the i-th port is acting as a load).

The method 100 of compensated calibration further comprises compensating 130 measured S-parameter data for the DUT using the delta-match factor $M_i$. In a preferred embodiment applicable to a two-port DUT, the step of compensating 130 comprises computing compensated S-parameters from measured S-parameters for the DUT according to equations (2) and (3)

$$\hat{S}_{nn} = \frac{S_{nn}}{1 - M_i S_{nn}} \quad (2)$$

$$\hat{S}_{mn} = \frac{S_{mn}}{1 - M_i S_{nn}} \quad (3)$$

where the compensated S-parameters $\hat{S}_{mn}$, $\hat{S}_{nn}$ are given in terms of the measured or uncompensated S-parameters $S_{mn}$, $S_{nn}$ and the i-th port delta-match factor $M_i$. In equations (2) and (3) the subscript i of the delta-match factor $M_i$ refers to the i-th port of the VNA. The subscripts n and m of the S-parameters refer to a first and second port of the two-port DUT, respectively, as is conventional for naming S-parameters. For example, if the first port of the two-port DUT is connected to port-3 of the VNA and a second port of the two-port DUT is connected to port-5 of the VNA, the delta-match factor $M_3$ of port-3 is used in equations (2) and (3). Likewise for the example, the two-port DUT S-parameter subscript nn refers to '11' (e.g., $S_{11}$ or $\hat{S}_{11}$) and the S-parameter subscript mn of equation (3) refers to '21' (e.g., $S_{21}$ or $\hat{S}_{21}$).

In some embodiments, the measured or uncompensated S-parameters are raw S-parameter data for the DUT. As used herein, the term 'raw' refers to data or S-parameters prior to the application of a correction for systematic errors using calibration-based error coefficients for an error model associated with the VNA. Similarly, the term 'calibrated' refers to data or S-parameters that have been corrected for systematic errors according to a calibration, such as a TRL calibration, of the VNA. Thus, the compensation 130 of the method 100 embodied in equations (2) and (3) is applied to the raw S-parameter data for the DUT to produce compensated data. Then the compensated data is corrected using for example, a conventional eight-term calibration, to produce compensated calibrated S-parameter data for the DUT.

It is also within the scope of the present invention to compensate 130 the measured S-parameters subsequent to calibration rather than prior to calibration. In other words, the measured S-parameter data may be corrected for systematic errors according to a conventional calibration and then compensated 130 using the appropriate port delta-match factor $M_i$. Of course, as one skilled in the art will readily recognize, equations (2) and (3) must be modified to account for such a change in the order of compensation and calibration. The modification of equations (2) and (3) to produce compensated calibrated S-parameter data can be readily accomplished by one skilled in the art without undue experimentation using conventional flowgraph methodologies.

Figure 4:
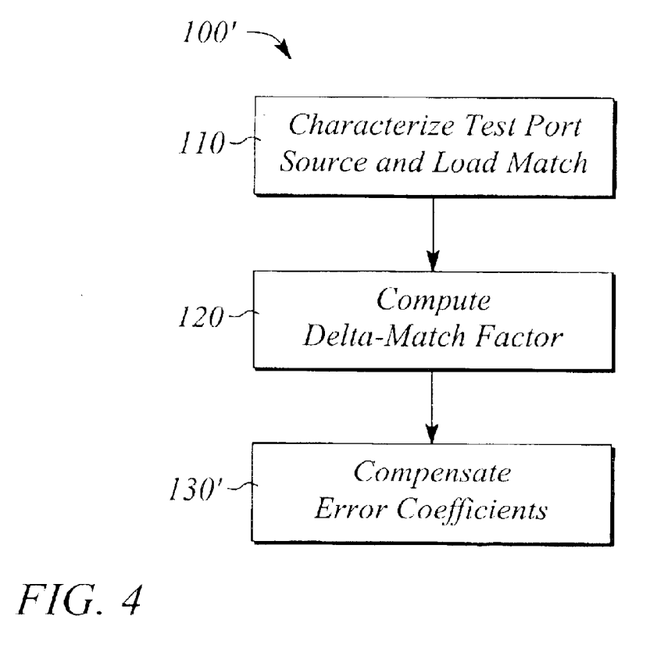
FIG. 4 illustrates a flow chart of another embodiment of a method of compensating a calibration of a vector network analyzer according to the present invention.

FIG. 4 illustrates a flowchart of another embodiment of the method 100' of compensated calibration of a VNA of the present invention. The method 100' comprises characterizing 110 a source match and a load match of a test port of the VNA, preferably in terms of source and load match error coefficients $e11S_i$ and $e11L_i$ for the i-th test port. The method 100' further comprises computing 120 a delta-match factor $M_i$ for the i-th test port. Both characterizing 110 and computing 120 are the same as described hereinabove for the method 100 unless specified otherwise. The method 100' further comprises computing 130' compensated error coefficients from error coefficients determined for an eight-term error model of the VNA using the computed delta-match factor $M_i$.

Computing 130' comprises converting the eight-term error model coefficients into equivalent coefficients for an error model that accounts for differences in the source and load match, and compensating the equivalent coefficients. Preferably, the eight-term error coefficients are converted into a twelve-term model and compensation is applied to the twelve-term coefficients. The conversion to the twelve-term model enables the characterized 110 source/load match difference embodied in the delta-match factor $M_i$ to be re-introduced and explicitly accounted for in terms of compensated error coefficients of the twelve-term error model. In other words, since the twelve-term error models has separate terms for source and load match error coefficients, the characterized 110 difference may be explicitly represented by these separate terms. For example, the uncompensated eight-term error coefficients may be converted into a set of compensated twelve-term error coefficients by employing equations (4), (5), (6), (7) and (8).

$$\hat{e}00_i = \frac{e00_i}{1 - M_i e00_i} \quad (4)$$

$$\hat{e}10_i \hat{e}01_i = \frac{e10_i e01_i}{(1 - M_i e00_i)(1 - M_i e00_i)} \quad (5)$$

$$\hat{e}10_i \hat{e}01_j = \frac{e10_i e01_j}{(1 - M_i e00_i)(1 - M_j e00_j)} \quad (6)$$

$$\hat{e}11S_i = e11_i + \frac{e10_i e01_i M_i}{(1 - M_i e00_i)} \quad (7)$$

$$\hat{e}11L_i = e11_i \quad (8)$$

The circumflexed terms (^) of equations (4)–(8) represent the compensated twelve-term error model coefficients. Terms without a circumflex are error coefficients determined from the eight-term calibration of the VNA and an optional test fixture. In particular, equation (6) converts the eight-term error model directivity term $e00_i$ for the i-th port into a compensated twelve-term error model directivity term $\hat{e}00_i$ wherein the compensation accounts for the formerly characterized 110 source/load match difference of the i-th test port. The compensated reflection tracking term $\hat{e}10_i \hat{e}01_i$ and transmission tracking term $\hat{e}10_i \hat{e}01_j$ are computed from equivalent terms of the eight-term model (i.e., $e01_i e10_i$, and $e01 e01_j$) using equations (5) and (6) respectively. The eight-term model has only a single port match error coefficient for each test port given as $e11_i$ since the eight-term model explicitly assumes that the source and the load match are equal for each port. Equations (7) and (8) enable the compensated source match error coefficient ê11S$_i$ and the load match error coefficient ê11L$_i$ of the twelve-term error model to be computed from the single port match error coefficient e11$_i$ determined by the eight-term calibration performed on the VNA and test fixture. Thus, all of the compensated twelve-term error coefficients necessary to produce calibrated measurements of the DUT using the VNA and test fixture may be computed by applying equations (4)–(8) to the determined error coefficients of the eight-term calibration with appropriate values for the subscripts i and j.

Figure 5:
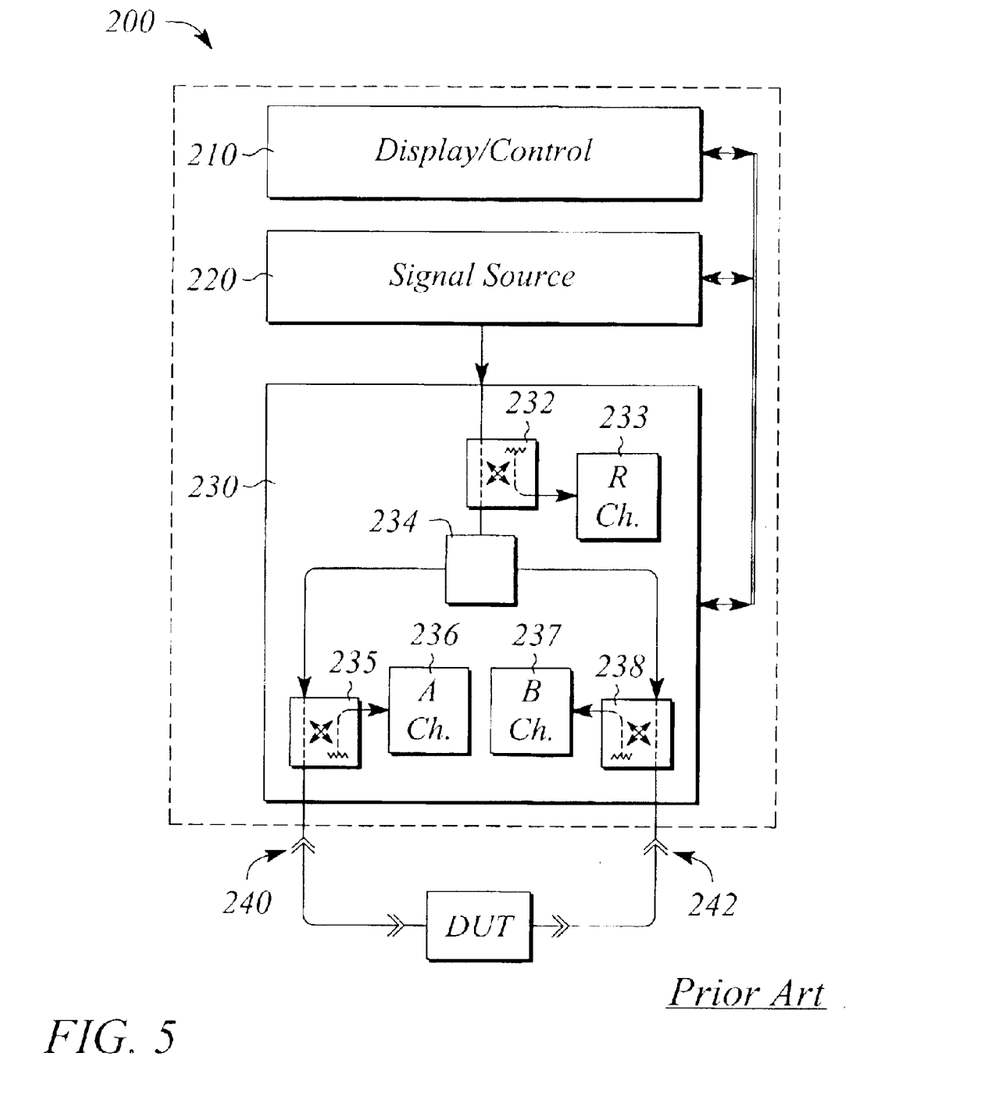
FIG. 5 illustrates a block diagram of a typical two-port vector network analyzer.

To better appreciate the method 100, 100' of compensated calibration of the present invention, consider its application to calibrating a two-port VNA using a TRL calibration and assuming in-fixture testing of a DUT. A representative block diagram of a typical two-port VNA 200 is illustrated in FIG. 5. The VNA 200 comprises a display/control module 210, a signal source 220, a test set 230, a first test port 240 and a second test port 242. A typical test set 230 comprises a first coupler 232, a first or reference (R) channel receiver 233, a transfer switch 234, a second coupler 235, a second (or A) channel receiver 236, a third coupler 238, and a third (or B) channel receiver 237. In another configuration (not illustrated) the test set 230 may have a transfer switch prior to the reference channel receiver 233 and have a coupler and reference channel on each path after the switch.

The signal source 220 generates a signal that is applied to the test set 230. Within the test set 230, the first coupler 232 samples the signal and the sampled signal is applied to the R-channel receiver 233. The signal is then applied to the transfer switch 234 which routes the signal to either the first test port 240 or the second test port 242 depending on which port is to serve as a source for testing the DUT. Signals entering the VNA 200 by way of the first test port are separated from the test signal by the second coupler 235 and applied to the A-channel receiver 236. Similarly, signals entering the VNA 200 by way of the second test port 242 are routed to the B-channel receiver 237 by the third coupler 238. Signals entering the first test port 240 result from DUT forward reflection and are related to S$_{11}$ while signals entering the second test port 242 result from DUT forward transmission and are related to S$_{21}$ when the first test port 240 is acting as the source for the DUT. Likewise, when the second test port 242 is acting as the source, signals entering the second test port 242 result from DUT reverse reflection and are related to S$_{22}$ while signals entering the first test port 240 result from DUT reverse transmission and are related to S$_{12}$. Thus, by measuring signal magnitude and phase at each of the R-channel 233, A-channel 236, B-channel 237 receivers, S-parameters for the DUT can be determined. VNAs and their operation are familiar to those of ordinary skill in the art. Details of VNA architecture and operation is available from a variety of sources including Agilent application note AN 1287-2, Exploring the Architectures of Network Analyzers, incorporated herein by reference.

In this example of using method 100, the step of characterizing 110 the source match and the load match of each of the test ports 240, 242 is accomplished by performing an SOLT calibration of the example two-port VNA 200. In particular, the SOLT calibration is performed using a pair of short coaxial cables to connect the test ports 240, 242 and using a set of coaxial SOLT calibration standards. The set of SOLT calibration standards includes a precision open, a precision short, and a precision load. The thru calibration standard consists of connecting the cables to one another.

The source match and load match error coefficients e11S$_i$, e11L$_i$ of each of the two test ports 240, 242 are characterized 110 using the error coefficients developed from the SOLT calibration. Thus for the first port 240 (i.e., port-1), the source match error coefficient e11S$_1$ and the load match error coefficient e11L$_1$ are determined from the forward portion of the SOLT calibration. Similarly, the source match and load match error coefficients e11S$_2$, e11L$_2$ are determined from the reverse portion of the SOLT calibration.

A delta-match factor for each of the ports is computed 120 using equation (1). In particular the delta-match factors for the first port 240 (port-1) and the second port 242 (port-2) are given as $$M_1 = \frac{e11S_1 - e11L_1}{e10_1 e01_1 - e00_1(e11S_1 - e11L_1)} \tag{9}$$

$$M_2 = \frac{e11S_2 - e11L_2}{e10_2 e01_2 - e00_2(e11S_2 - e11L_2)} \tag{10}$$

where the terms used above correspond to those from the forward and reverse portions of the twelve-term model illustrated in FIGS. 2A and 2B. Equation (9) gives the delta-match factor M$_1$ for the first port 240 and equation (10) gives the delta-match factor M$_2$ for the second port 240. Once computed 120, the delta-match factors M$_1$, M$_2$ may be stored in memory in the VNA 200 for use when testing a DUT.

Continuing with the example, the VNA 200 is connected to a test fixture that accommodates the DUT. A TRL calibration is performed on the combination of the VNA 200 and the test fixture and a set of error coefficients for the eight-term error model for the TRL calibration are measured and determined. Once the TRL calibration is performed with the delta-match factor M$_i$ applied to all of the raw measurements of the TRL calibration standards, the DUT may be inserted into the test-fixture and tested. In particular, a set of calibrated S-parameters can be measured for the DUT employing the TRL calibration error coefficients. The calibrated S-parameters for the DUT are first compensated 130 for the effects of source/load match differences at the two test ports 240, 242 using equations (2) and (3) and the appropriate delta-match factor M$_i$. For example, a raw S-parameter S$_{11}$ for the DUT is compensated 130 using equation (2) and the port-1 delta-match factor M$_1$ to produce a compensated S-parameter Ŝ$_{11}$. Similarly, equation (3) and the port-2 delta-match factor M$_2$ are used to compensate 130 the raw S-parameter S$_{12}$ for the DUT to produce a compensated S-parameter Ŝ$_{12}$. Conventional calibration then may be applied. As is consistent with conventional calibration of VNAs, a different delta-match factor M$_i$ may be, and generally is, necessary at each discrete frequency for which a DUT is to be measured.

In yet another aspect of the present invention, a method 300 of compensating a calibration of a multiport vector network analyzer (VNA) that employs switched receivers is provided. As used herein, 'receiver' refers to a collection of signal monitoring components used in a VNA to sample, detect, and quantify a signal at a test port of the VNA. Many multiport VNA implementations do not have a dedicated receiver or receiver channel for each test port, but instead provide fewer receivers than test ports. For example, an eight-port VNA having eight test ports may have only three receivers. In such multiport vector network analyzers, test port switching, either manual or automatic, is used to 'share' the test port receivers among the various test ports. The method 300 for compensating a calibration essentially extends the method 100, 100' to multiport VNAs with switched receivers. In addition, the method 300 may also account for tracking term variations associated with receiver switching. Advantageously, accounting for tracking term variations according to the present invention enables a reduction in a number of calibration terms that must be measured in order to fully calibrate the multiport VNA.

Figure 6:
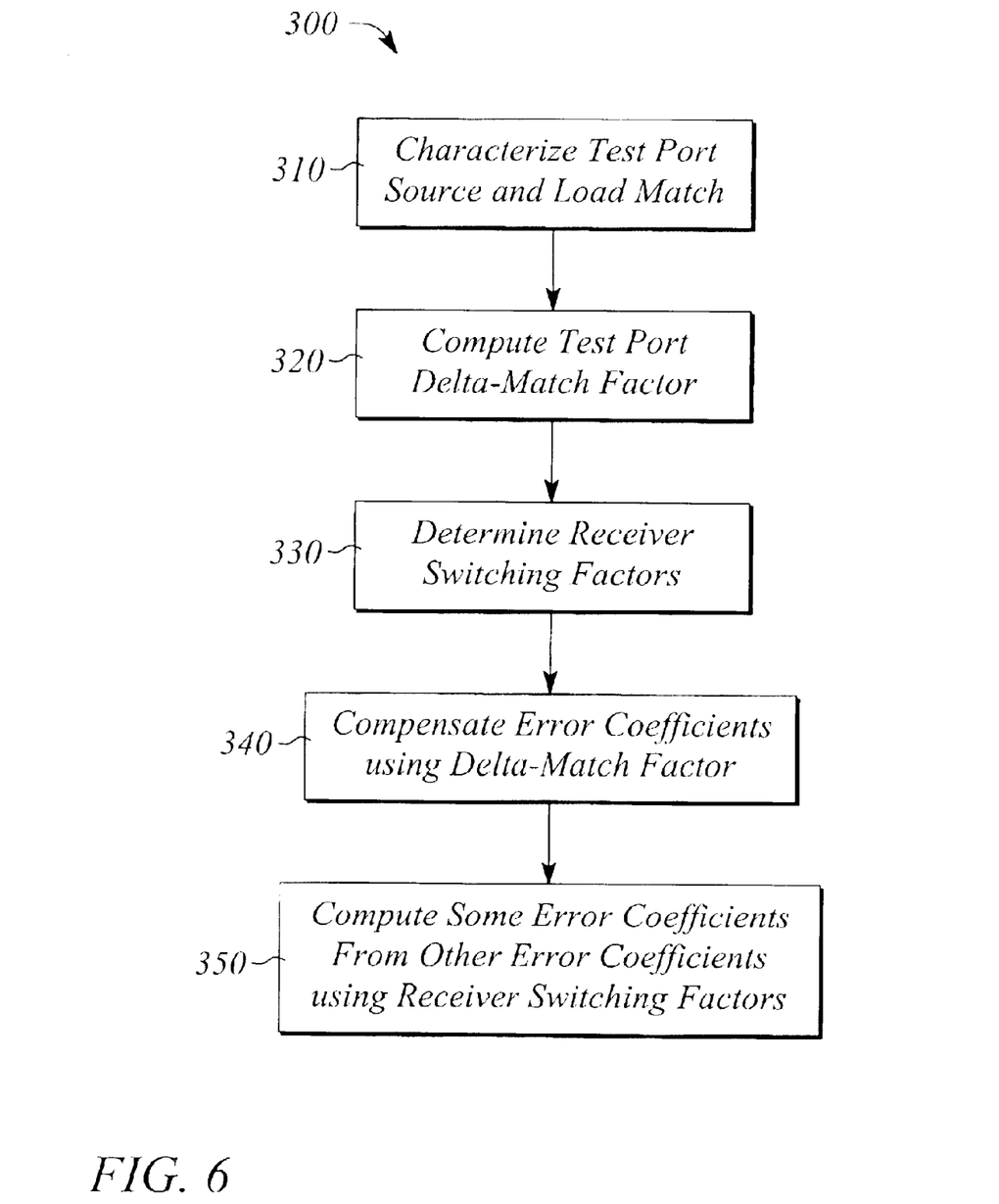
FIG. 6 illustrates a flow chart of an embodiment of a method of compensating a calibration of a multiport vector network analyzer that employs switched receivers according to the present invention.

FIG. 6 illustrates a flow chart of the method 300 of compensating a calibration of a multiport vector network analyzer. The method 300 of compensating a calibration of a multiport vector network analyzer comprises characterizing 310 a source match and a load match of each of a plurality of test ports of the VNA. In a preferred embodiment, a different characterization 310 is performed for each of a plurality of different receivers that may be switched to a given test port. In other words, each different receiver is switched to the test port, and the source and load match are characterized 310. Preferably, the source and load match are characterized 310 by determining a source match error coefficient $e11S_{i,r}$ and a load match error coefficient $e11L_{i,r}$, where the subscript 'i' indicates the test port number and the subscript 'r' identifies a receiver. For example, if a third receiver (i.e., r=3) is switched to port-2 during the characterization 310, then the source match error coefficient $e11S_{2,3}$ and the load match error coefficient $e11L_{2,3}$ are determined. Except for switching receivers and tracking which receiver is switched to which port, characterizing 310 is essentially the same as characterizing 110 as described hereinabove with respect to method 100, 100'.

The method 300 of compensating further comprises computing 320 a test port delta-match factor from the characterized 310 source match and load match. Preferably, a different delta-match factor is computed 320 for each different receiver that may be switched to a given port. In a preferred embodiment, the delta-match factor $M_{i,r}$ for the i-th test port with an r-th receiver switched thereto is given by equation (11) since Normally $e11S_{i,r}$ is constant for all r.

$$M_{i,r} = \frac{e11S_{i,r} - e11L_{i,r}}{e10_{i,r}e01_{i,r} - e00_{i,r}(e11S_{i,r} - e11L_{i,r})} \quad (11)$$

where the term $e00_{i,r}$ is the i-th port directivity term or coefficient and the product term $e10_{i,r}e01_{i,r}$ is the i-th port reflection tracking term of the twelve-term error model of FIGS. 2A and 2B with the i-th port acting as the port-1 and the r-th receiver switched to the i-th port. Likewise, the terms $e11S_{i,r}$ and $e11L_{i,r}$ in equation (11) are the i-th port source match error coefficient $e11S_i$ from the forward portion of the twelve-term error model and the i-th port load match error coefficient $e11L_i$ from the reverse portion of the twelve-term error model, respectively, with the r-th receiver switched to the i-th port.

In some embodiments, an affect of switching receivers on the source/load match difference may be determined to be small. In such embodiments, a single characterization 310 may be performed and the delta-match factor $M_i$ may be computed 320 using equation (1) instead of equation (11). For example, given the test port designated by the subscript i, a first receiver switched to port-i designated by the subscript r, and a second receiver switched to port-i designated by a subscript s, where r is not equal to s, if $M_{i,r} = M_{i,s}$ for all r, then a single characterization 310 involving only one of the r receivers need be performed. Moreover, with a single characterization 310, equation (1) is indistinguishable from equation (11) so that equation (1) may be used instead of equation (11). One skilled in the art can readily determine whether multiple characterizations, at least one for each receiver that can be switch to the test port, are necessary without undue experimentation.

The method 300 further comprises determining 330 a set of receiver switching factors $F_{i,r,s}$ for each of the i test ports. In particular, the set of receiver switching factors $F_{i,r,s}$ accounts for differences in directivity and tracking terms of the error models, the differences being associated with different receivers being switched to a given test port. In general, the receiver switching factors $F_{i,r,s}$ are a function of the test port designated by the subscript i, the first receiver switched to port-i designated by the subscript r, and the second receiver switched to port-i designated by the subscript s, as mentioned above.

Advantageously in many practical VNA implementations, a source-to-test port portion (i.e., $e10_i$) of the tracking term $e10_ie01_i$ from the twelve-term error model illustrated in FIG. 2A and 2B is essentially independent of receiver switching. In other words, the source-to-test port portion $e10_i$ does not change appreciably when different receivers are switched to port-i. In such practical VNA implementations, a test port-to-receiver portion (i.e., $e01_i$) of the tracking term $e10_ie01_i$ embodies variations associated with or caused by switching different receivers to the test port.

In particular, when transmission tracking variations due to receiver switching are confined to the test port-to-receiver portion $e01_i$ of the tracking term, the receiver switching factor $F_{i,r,s}$ may be computed as simply a ratio of the test port-to-receiver portion $e01_{i,r}$ for a first receiver r and the test port-to-receiver portion $e01_{i,s}$ for a second receiver s. In other word, the receiver switching factor $F_{i,r,s}$ may be determined using equation (12).

$$F_{i,r,s} = \frac{e10_ie01_{i,r}}{e10_ie01_{i,s}} = \frac{e01_{i,r}}{e01_{i,s}} \quad (12)$$

Thus, a set of receiver switching factors $F_{i,r,s}$ may be determined for each test port, the set comprising each unique ratio as given by equation (12) that can be formed given the plurality of receivers that may be switched to the test port. A single connection of standards can be used to characterize all of the switching factors for a given port. Each standard is connected once and measured for each receiver.

A variation in the directivity terms is the same as the variation in the reflection tracking terms. Thus, the variation in directivity is given by equation (13).

$$e00_{i,r} = F_{i,r,s}e00_{i,s} \quad (13)$$

Obviously, there are fewer unique ratios than there are combinations of receivers r and s. Advantageously, the receiver switching factors $F_{i,r,s}$ may be determined from error coefficients determined 330 from measurements performed with the VNA during the source/load match characterization 310. Alternatively, the receiver switching factors $F_{i,r,s}$ may be determined either prior to or subsequent to characterizing 310 the source/load match. For example, the receiver switching factors may be determined from measured error coefficients produced during the course of a calibration of the VNA subsequent to the source/load match characterization 310.

The method 300 further comprises compensating 340 error coefficients of the multi-term error model using the delta-match factor $M_{i,r}$. Compensating 340 is essentially the same as compensating 130 of method 100 described hereinabove except that there is a choice of delta-match factors for use in compensating 340. Which delta-match factor to use in compensating 340 is determined from which particular receiver-switching configuration is used during the calibration and the subsequent testing of the DUT. For example, if a second receiver (e.g., r=2) is switched to port-1, then the delta match factor $M_{1,2}$ is used in compensating 340. Of course, in situations where the delta-match factor is not a function of receiver switching, compensating 340 need not account for receiver switching and thus essentially becomes compensating 130.

The method 300 further comprises computing 350 some of the error coefficients of the multi-term error model from the compensated error coefficients and using the receiver switching factors $F_{i,r,s}$. In particular, given the set of receiver switching factors $F_{i,r,s}$ it not necessary to measure or determine all of the transmission tracking terms (e.g., $e10_je01_{i,r}$) for all possible combinations of receivers at the i-th port. A minimal number of such combinations needs to be measured or otherwise directly determined. Given a set of receiver switching factors $F_{i,r,s}$, the minimal number of such measured tracking terms is N−1, where N is the total number of test ports. From the minimal number, all other transmission tracking terms $e10_je01_{i,r}$ may be computed 350 using the receiver switching factors $F_{i,r,s}$. For example, a method of generating a minimal set that insures the possibility of computing a complete set of transmission tracking terms is to measure transmission tracking between one selected port and all of the other ports.

To better understand computing 350 some multi-term error model coefficients from the compensated coefficients according to the present invention, assume, for example, that a transmission tracking error coefficient $e10_je01_{i,A}$ between port-j and port-i has been measured or otherwise determined with receiver A switched to port-i during a calibration of a VNA. A transmission tracking error coefficient between port-j and port-i with receiver C switched to port-i may be computed 350 using a determined 330 receiver switching factor $F_{i,C,A}$. In particular, the transmission tracking error coefficient $e10_je01_{i,C}$ may be computed 350 as given in equation (14).

$$e10_je01_{i,C} = (e10_je01_{i,A}) \cdot F_{i,C,A} \quad (14)$$

In another example, assume that a transmission tracking error coefficient $e10_je01_{i,A}$ between port-j and port-i has been measured or otherwise determined with receiver A switched to port-i during a calibration of a VNA. Furthermore, assume that a transmission tracking error coefficient $e10_ie01_{k,D}$ from port-i to port-k with receiver D switched to port-k has been measured or otherwise determined during the calibration. A transmission tracking error coefficient $e10_je01_{k,C}$ between port-j and port-k with receiver C switched to port-k may be computed using determined 330 receiver switching factors $F_{i,B,A}, F_{k,C,D}$ for the i-th, and k-th ports as given by equation (15).

$$e10_je01_{k,C} = \frac{(e10_je01_{i,A})(e10_ie01_{k,D})}{e10_ie01_{i,B}} \cdot F_{i,B,A} \cdot F_{k,C,D} \quad (15)$$

Notice that in this example, use has been made of a reflection tracking error coefficient $e10_ie01_{i,B}$ as well to compute 350 the transmission tracking term $e10_je01_{k,C}$. Given the discussion herein, one skilled in the art may readily devise similar such examples of computing 350 using the sets of determined receiver switching factors $F_{i,r,s}$ without undue experimentation according to the present invention. In general, equation (15) is only strictly accurate after match normalization has been performed.

In another aspect of the invention, a vector network analyzer (VNA) 400 having a compensated calibration is provided. The VNA 400 is illustrated as a block diagram in FIG. 7. The VNA 400 comprises a display/control module 410, a signal source 420, a test set 430, and a plurality of test ports 440. The display/control 410 comprises a controller 412, a memory 414, and a computer program 416 stored in the memory 414 and executed by the controller 412. The test set 430 comprises a plurality of receivers (not illustrated). The computer program 416, when executed by the controller 412, in part provides for a compensated calibration of the VNA 400. Preferably, the computer program 416 comprises executable instructions that implement the method 100, 100' of the present invention.

Figure 7:
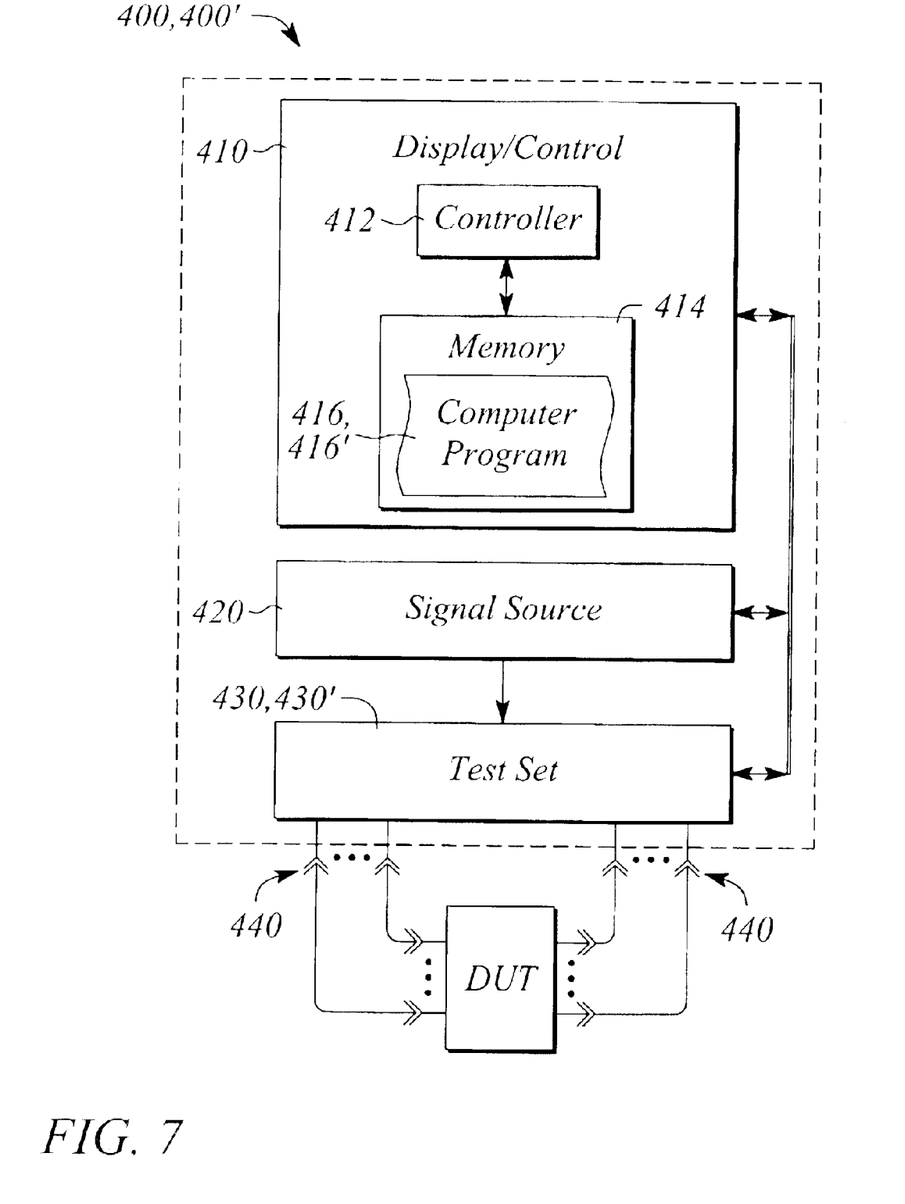
FIG. 7 illustrates a block diagram of an embodiment of a vector network analyzer having a compensated calibration according to the present invention.

In particular, the executed computer program 416 characterizes a source match and a load match of each of the test ports of the plurality of test ports 440. Once the test ports 440 are characterized, the computer program 416 computes a delta-match factor $M_i$ for each of the characterized test ports 440. Preferably, the delta-match factor $M_i$ is computed by employing equation (1) or an equivalent. The computed delta-match factors $M_i$ are either used by the computer program 416 to compensate S-parameter data measured by the VNA 400, as described for method 100 hereinabove, or combined with error terms of a calibration of the VNA 400 to compute compensated error coefficients, as described for method 100' hereinabove. In the former case, the compensated S-parameters data may be further corrected by using error coefficients of an error model to produce compensated calibrated S-parameter data. In the latter case, the compensated error coefficients may be used to correct raw measured S-parameter data to produce compensated calibrated S-parameter data.

In another embodiment, the VNA 400' is a multiport vector network analyzer having switched receivers. In such an embodiment, the test set 430' further comprises a switch matrix (not illustrated). The switch matrix interconnects the plurality of receivers and the signal source 420 to the plurality of test ports 440. In addition to compensating for the source/load match differences, the computer program 416' of the VNA 400' may compute some of the error coefficients of a calibration from at least a minimal set of determined or measured coefficients. In a preferred embodiment, instructions of the computer program 416' implement the method 300 of the present invention.

In particular, instructions of the a computer program 416 of the VNA 400', when executed by the controller 412, characterize the source/load match of the ports 440, compute the delta-match factors $M_{i,k}$ for each port/receiver combination, and compute a set of receiver match factors $F_{i,r,s}$ for each port of the plurality of test ports 440. Preferably, the delta-match factor $M_{i,k}$ is computed by employing equation (11) or an equivalent, while the receiver switching factors $F_{i,r,s}$ are computed using equation (12) or an equivalent. The computer program 416' further compensates a calibration and determines some error coefficients from other error coefficients using the delta-match factors $M_{i,k}$ and receiver switching factors $F_{i,r,s}$, respectively.

Thus, there has been described embodiments of a method 100, 100' of compensating a calibration of a vector network analyzer, embodiments of a method 300 of compensating a calibration of a multiport switched receiver vector network analyzer, and embodiments of a vector network analyzer 400, 400' with compensated calibration. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of compensating a calibration of a vector network analyzer comprising:
   characterizing a source match and a load match of each test port of the vector network analyzer;
   computing a delta-match factor from the characterized source match and load match for each test port; and
   compensating for a difference in the source match and the load match using the delta-match factor.

2. The method of claim 1, wherein characterizing the source match and the load match comprises:
   determining a value for a source match error coefficient and another value for a load match error coefficient of an error model at each test port.

3. The method of claim 2, wherein determining the values comprises using a twelve-term error model as the error model.

4. The method of claim 1, wherein computing the delta-match factor comprises using a source match error coefficient, a load match error coefficient, a directivity error coefficient and a reflection tracking error coefficient of an error model for each test port.

5. The method of claim 1, wherein compensating for a difference comprises applying the delta-match factor to S-parameter data for a device under test measured with the vector network analyzer, such that the S-parameter data is compensated.

6. The method of claim 5, wherein the compensated S-parameter data is further corrected using error coefficients of an error model that is used to calibrate the vector network analyzer, such that the S-parameter data is both compensated and calibrated.

7. The method of claim 1, wherein compensating for a difference comprises applying the delta-match factor to error coefficients of an error model that is used to calibrate the vector network analyzer, such that the error coefficients are compensated.

8. The method of claim 7, wherein the compensated error coefficients are used to correct S-parameter data for a device under test measured with the vector network analyzer.

9. The method of claim 1, wherein computing the delta-match factor for each test port comprises using equation (1)

$$M_i = \frac{e11S_i - e11L_i}{e10_i e01_i - e00_i(e11S_i - e11L_i)} \quad (1)$$

wherein the subscript i refers to an i-th test port, the term $M_i$ is the delta-match factor for the i-th test port, the term $e11S_i$ is an error coefficient for the source match of the i-th test port, the term $e11L_i$ is an error coefficient for the load match of the i-th test port, the term $e00_i$ is a directivity term for the i-th port, and the product term $e10_i e01_i$ is a reflection tracking term for the i-th port of a twelve-term error model.

10. The method of claim 9, wherein compensating for a difference using the delta-match factor $M_i$ comprises:
    computing compensated S-parameters from measured S-parameters for a device under test according to equations (2) and (3):

$$\hat{S}_{nn} = \frac{S_{nn}}{1 - M_i S_{nn}} \quad (2)$$

$$\hat{S}_{mn} = \frac{S_{mn}}{1 - M_i S_{nn}} \quad (3)$$

wherein the terms $\hat{S}_{mn}$, $\hat{S}_{nn}$ are the compensated S-parameter, the terms $S_{mn}$, $S_{nn}$ are the measured S-parameters, and wherein the subscript i refers to the i-th test port.

11. The method of claim 1, wherein compensating for a difference comprises computing compensated error coefficients with the delta-match factor $M_i$ from error coefficients for an eight-term error model used to calibrate the vector network analyzer.

12. The method of claim 11, wherein computing compensated error coefficients with the delta-match factor $M_i$ comprises converting the error coefficients from the eight-term error model to equivalent error coefficients for a twelve-term error model employing equations (4), (5), (6), (7) and (8):

$$\hat{e}00_i = \frac{e00_i}{1 - M_i e00_i} \quad (4)$$

$$\hat{e}10_i \hat{e}01_i = \frac{e10_i e01_i}{(1 - M_i e00_i)(1 - M_i e00_i)} \quad (5)$$

$$\hat{e}10_i \hat{e}01_j = \frac{e10_i e01_j}{(1 - M_i e00_i)(1 - M_j e00_j)} \quad (6)$$

$$\hat{e}11S_i = e11_i + \frac{e10_i e01_i M_i}{(1 - M_i e00_i)} \quad (7)$$

$$\hat{e}11L_i = e11_i \quad (8)$$

wherein circumflexed terms (^) of equations (4)–(8) represent the compensated twelve-term error model coefficients and terms without a circumflex (^) are error coefficients determined from the eight-term error model calibration of the vector network analyzer and optionally, of a test fixture.

13. The method of claim 1, further comprising:
    determining a set of receiver switching factors from error coefficients measured for each combination of a receiver and a test port of the vector network analyzer, the receiver being connectable to the test port; and
    computing some error coefficients of an error model used in the calibration of the vector network analyzer from other error coefficients of the error model that were measured during the calibration using the receiver switching factors from the determined set.

14. The method of claim 13, wherein compensating for a difference comprises to applying the delta-match factor to the measured error coefficients, such that the measured error coefficients are compensated, and wherein computing some error coefficients applies a determined receiver switching factor to a compensated error coefficient to compute a respective unmeasured error coefficient of the calibration, such that a complete set of error coefficients of the calibration are compensated.

15. The method of claim 14, wherein the complete set of compensated error coefficients is used to correct S-parameter data for a device under test measured with the vector network analyzer, such that the S parameter data is both compensated and calibrated.

16. A method of compensating a calibration of a multiport vector network analyzer, the multiport vector network analyzer employing switched receivers comprising:
    characterizing a source match and a load match of each test port of the vector network analyzer;
    computing a delta-match factor from the characterized source match and load match for each combination of a receiver and a test port, the receiver being connectable to the test port;
    determining a set of receiver switching factors from error coefficients of a multi-term error model measured during the calibration of the vector network analyzer for each combination;

compensating the measured error coefficients of using the computed delta-match factor, such that the measured error coefficients are compensated; and computing unmeasured error coefficients of the multi-term error model from the compensated measured error coefficients using the determined set of receiver switching factors.

17. The method of claim 16, wherein characterizing the source match and the load match comprises:

determining a value for a source match error coefficient and another value for a load match error coefficient of an error model at each test port.

18. The method of claim 16, wherein computing a delta-match factor for each combination, where each combination comprises an i-th port switched to an r-th receiver, comprises using an i-th port directivity error coefficient and an i-th port reflection tracking error coefficient of a twelve-term error model with the r-th receiver switched to the i-th port, and using an i-th port source match error coefficient from a forward portion of the twelve-term error model and an i-th port load match error coefficient from a reverse portion of the twelve-term error model with the r-th receiver switched to the i-th port.

19. The method of claim 16, wherein determining a set of receiver switching factors comprises using a ratio of a reflection tracking error coefficient for a receiver switched to a test port to another reflection tracking error coefficient for another receiver switched to the test port for each combination of a test port switched between different receivers.

20. The method of claim 16, wherein a subset of error coefficients of the multi-term error model are measured during the calibration of the vector network analyzer, the measured subset being less than all of the error coefficients of the multi-term error mode, such that compensating the measured error coefficients comprises applying the delta-match factor to the measured subset; and wherein computing unmeasured error coefficients comprises computing a remaining subset of the error coefficients of the multi-term error model, the remaining subset equaling all of the error coefficients of the multi-term error model minus the measured subset.

21. The method of claim 20, wherein computing a remaining subset of error coefficients applies a determined receiver switching factor to a compensated error coefficient to compute a respective unmeasured error coefficient of the remaining subset, such that a complete set of error coefficients of the multi-term error model calibration are compensated.

22. The method of claim 21, wherein the complete set of compensated error coefficients is used to correct S-parameter data for a device under test measured with the vector network analyzer.

23. The method of claim 16, wherein computing the delta-match factor for each combination comprises for each combinations of an i-th test port with an r-th receiver switched thereto, using equation (11)

$$M_{i,r} = \frac{e11S_{i,r} - e11L_{i,r}}{e10_{i,r}e01_{i,r} - e00_{i,r}(e11S_{i,r} - e11L_{i,r})} \quad (11)$$

wherein $M_{i,r}$ is the delta-match factor for the i-th test port connected to the r-th receiver, the term $e00_{i,r}$ is an i-th port directivity error coefficient and the product term $e10_{i,r}e01_{i,r}$ is an i-th port reflection tracking error coefficient, both of a twelve-term error model with the i-th port acting as a first port and the r-th receiver switched to the i-th port; and wherein the term $e11S_{i,r}$ is an i-th port source match error coefficient from a forward portion of the twelve-term error model, and the term $e11L_{i,r}$ is an i-th port load match error coefficient from a reverse portion of the twelve-term error model, both with the r-th receiver switched to the i-th port.

24. A vector network analyzer having a compensated calibration comprising:

a test port;

a display and control module having a controller and a memory; and a computer program stored in the memory, wherein the controller executes the computer program, the executed computer program implementing instructions that compensate for unequal source and load matches at the test port.

25. The vector network analyzer of claim 24, wherein the instructions that compensate correct S-parameter data of a device under test measured by the vector network analyzer.

26. The vector network analyzer of claim 24, further comprising:

another test port, a signal source, and a test set, the signal source providing a signal to the test set, the test set comprising a transfer switch, a plurality of couplers and a plurality of receiver channels, a coupler being at an input of each receiver channel, a receiver channel being connectable to each test port, the transfer switch alternately providing the signal to the coupler at the input of each receiver channel connected to the test port.

27. The vector network analyzer of claim 24, wherein the implemented instructions comprise characterizing the source match and the load match of the test port, and computing a delta-match factor that corresponds to a difference between the source match and the load match.

28. The vector network analyzer of claim 27, wherein the implemented instructions further comprise using the computed delta-match factor to compensate S-parameter data measured by the analyzer for a device under test.

29. The vector network analyzer of claim 28, wherein the implemented instructions further comprise correcting the compensated S-parameter data by using error coefficients of an error model used to calibrate the vector network analyzer to produce compensated and calibrated S-parameter data.

30. The vector network analyzer of claim 27, wherein the implemented instructions further comprise combining the computed delta-match factor with error coefficients of a calibration of the vector network analyzer to compute compensated error coefficients.

31. The vector network analyzer of claim 30, wherein the implemented instructions further comprise using the compensated error coefficients to correct S-parameter data measured by the analyzer to produce compensated and calibrated S-parameter data.

32. The vector network analyzer of claim 31, wherein the implemented instructions further comprise determining a set of receiver switching factors from error coefficients measured for each combination of a receiver and a test port of the vector network analyzer; and computing some error coefficients from other error coefficients using the receiver switching factors from the determined set, the some error coefficients and the other error coefficients being error coefficients of an error model used in calibrating the analyzer, the other error coefficients being measured during the calibration, the some error coefficients being unmeasured during the calibration.

33. The method of claim 16, wherein determining a set of receiver switching factors for each combination, the combinations being an i-th test port switched between a r-th reveiver and an s-th receiver, comprises using equation (12)

$$F_{i,r,s} = \frac{e10_i e01_{i,r}}{e10_i e01_{i,s}} = \frac{e01_{i,r}}{e01_{i,s}}$$

where $F_{i,r,s}$ is the receiver switching factor for the i-th test port switched between the r-th receiver and the s-th receiver, the product term $e10_i e01_{i,r}$ is a reflection tracking error coefficient of a twelve-term error model for the i-th test port connected to the r-th receiver, the product term $e10_i e01_{i,s}$ is a reflection tracking error coefficient of the twelve-term error model for the i-th test port connected to the s-th receiver.

* * * * *